US006600606B2

(12) United States Patent
Sekine

(10) Patent No.: US 6,600,606 B2
(45) Date of Patent: Jul. 29, 2003

(54) PROJECTION OPTICAL SYSTEM WITH DIFFRACTIVE OPTICAL ELEMENT

(75) Inventor: Yoshiyuki Sekine, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/805,133

(22) Filed: Mar. 14, 2001

(65) Prior Publication Data

US 2002/0008911 A1 Jan. 24, 2002

(30) Foreign Application Priority Data

Mar. 15, 2000 (JP) ........................................ 2000-072683

(51) Int. Cl.$^7$ ................................................. G02B 3/00
(52) U.S. Cl. ........................................ 359/649; 359/566
(58) Field of Search ................................. 359/565, 566, 359/571, 574, 573, 649–651, 742, 738, 739, 740

(56) References Cited

U.S. PATENT DOCUMENTS

| 5,227,915 A | * | 7/1993 | Grossinger et al. | .......... 359/565 |
| 5,623,365 A | | 4/1997 | Kuba | .......................... 359/569 |
| 6,266,192 B1 | * | 7/2001 | Sekine et al. | ................ 359/569 |

FOREIGN PATENT DOCUMENTS

| EP | 0 863 440 | 9/1998 | ............. G03F/7/20 |
| JP | 5-150107 | 6/1993 | |
| JP | 6-331941 | 12/1994 | ........... G02B/27/42 |
| JP | 10-303127 | 11/1998 | ........... H01L/21/27 |

OTHER PUBLICATIONS

Moharam et al., "Formulation for stable and efficient implementation of the rigorous coupled–wave analysis of binary gratings", *J. Opt. Soc. Am. A*, vol. 12, No. 5, May 1995.

Swanson, "Binary Optics Technology: The Theory and Design of Multi–Level Diffractive Optical Elements", *Massachusetts Institute of Technology Lincoln Laboratory Technical Report 854*, Aug. 14, 1989.

Swanson, "Binary Optics Technology: The Theory and Design of Multi–Level Diffractive Optical Elements", *Massachusetts Institute of Technology Lincoln Laboratory Technical Report 914*, Mar. 1, 1991.

* cited by examiner

*Primary Examiner*—Georgia Epps
*Assistant Examiner*—M. Hadan
(74) *Attorney, Agent, or Firm*—Fitzpatrick, Cella, Harper & Scinto

(57) ABSTRACT

An optical system includes an aperture stop and binary optics having a plurality of rings disposed adjacent to the aperture stop. The rings of the binary optics have different mutual intervals and have a step-like structure formed at each interval. When the interval of arbitrary rings of the rings, which are juxtaposed with each other, is T and the number of steps defined in that interval is N, the following relation is satisfied in all the rings included in the binary optics $16 \geq N \geq T \cdot \sin \theta_h / \lambda$, where $\lambda$ is a representative value for a wavelength of light used in the optical system, and $\theta_h$ is an angle defined, with respect to an optical axis of the optical system, by a light ray emitted from an object point at a largest object height and passing a center of the aperture stop.

15 Claims, 5 Drawing Sheets

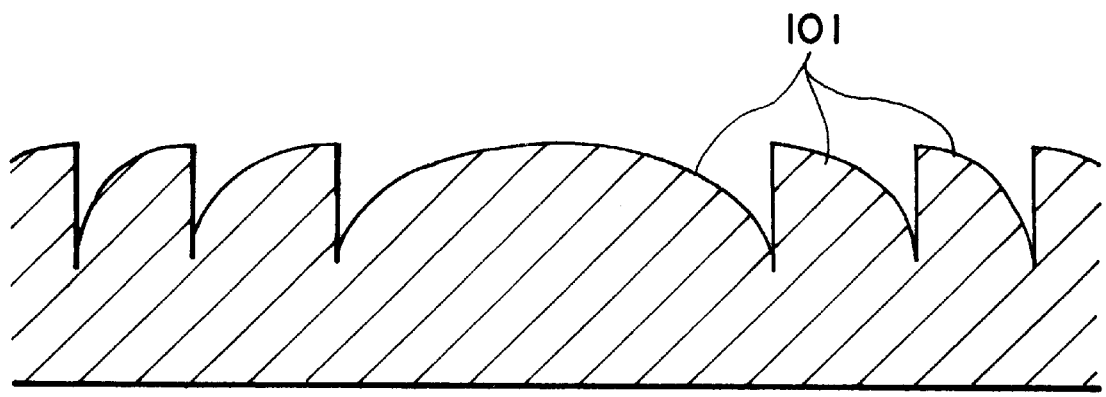
F I G. IA
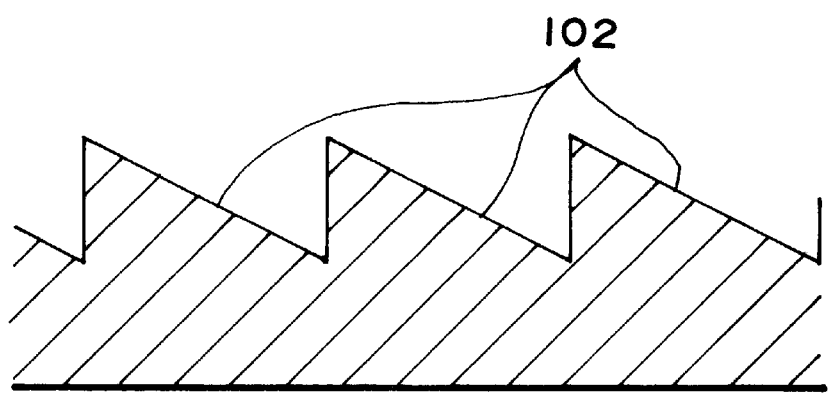
F I G. IB

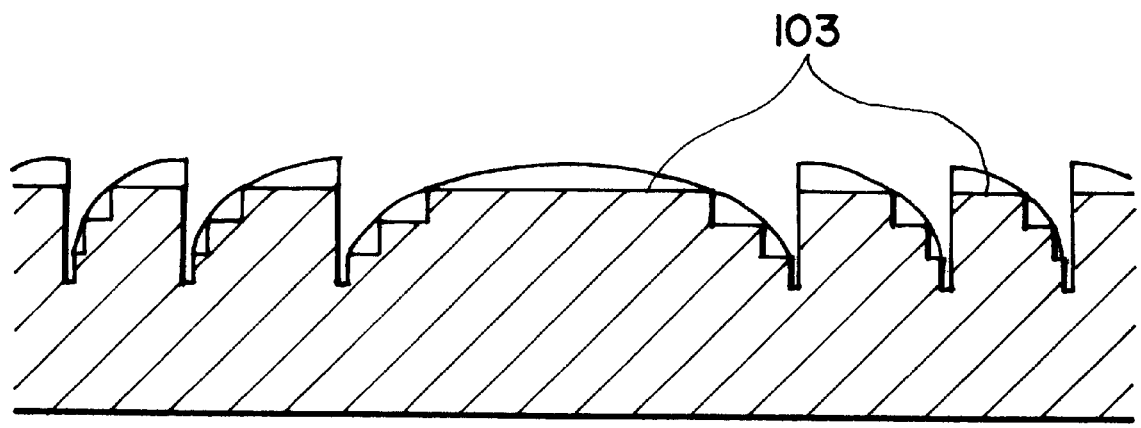
F I G. 2A
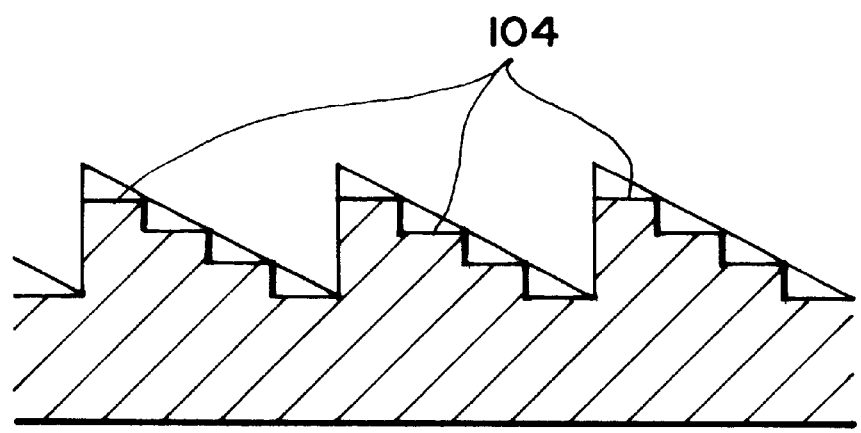
F I G. 2B

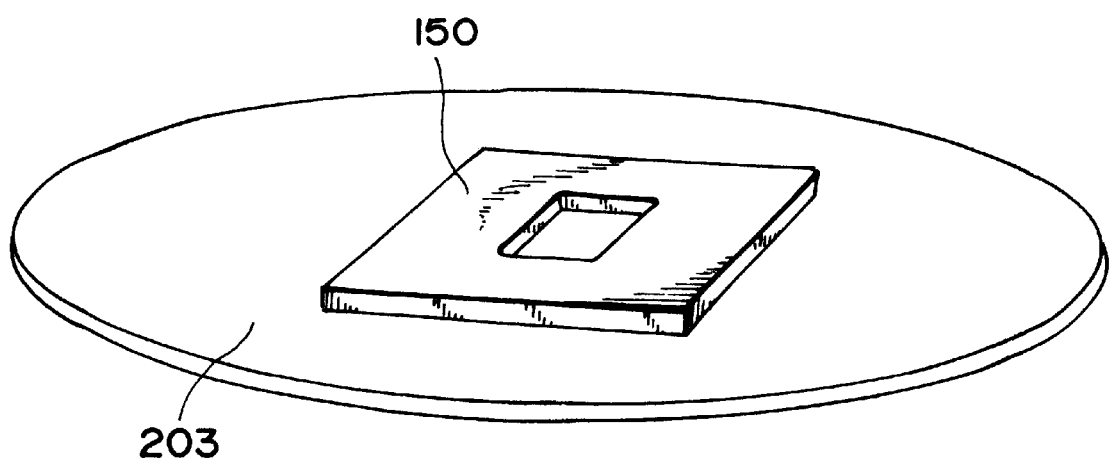
F I G. 6

PROJECTION OPTICAL SYSTEM WITH DIFFRACTIVE OPTICAL ELEMENT

FIELD OF THE INVENTION AND RELATED ART

This invention relates to an optical system having a diffractive optical element. More particularly, the invention concerns an optical system suitably usable in a semiconductor manufacturing apparatus, for example, for printing, by projection exposure, a device pattern formed on a reticle or a mask (hereinafter, mask) on different locations on a wafer in accordance with a step-and-repeat method or a step-and-scan method, to produce various devices having a pattern of submicron or quarter-micron size or smaller, such as ICs, LSIs, CCDs or liquid crystal panels, for example.

Most optical systems, including projection optical systems, of semiconductor manufacturing apparatuses are constituted by dioptric systems only. Recently, however, many proposals have been made to an optical system using a diffractive optical element (DOE). Examples of such diffractive optical elements are a phase type diffractive optical element or an amplitude type diffractive optical element, known as a Fresnel zone plate. In the amplitude type, a portion of light is blocked by the optical element and, therefore, it is undesirable with respect to the efficiency of light utilization. In the phase type diffractive optical element, on the other hand, it is known that, if it is assuredly manufactured to provide an idealistic phase change, a diffraction efficiency of 100% is attainable. Particularly, those called a surface relief type are used in many cases in an ordinary optical system. In this type, a structure is defined in the depth direction of the element substrate, by which a phase change corresponding to the position on the element surface is applied to the light passing therethrough. The depth which is normally required is of a wavelength order, and the thickness of the element can be made small. Further, various phase changes can be accomplished by changing the position of the structure. Thus, for ordinary dioptric systems, an effect such as attainable by forming an aspherical surface can be attained widely. The function for describing phase changes applied to light in accordance with the position on the element surface is called a phase function.

Another feature of diffractive optical elements is that a color dispersion appears inversely to that of a dioptric system. Based on this feature, chromatic aberration produced by a dioptric system can be corrected by use of a diffractive optical element.

Due to these features, diffractive optical elements may be suitably used in a projection optical system for a semiconductor manufacturing apparatus. Conventionally, the light used with such an optical system has a wavelength of i-line ($\lambda$=356 nm). As for such a wavelength, there are plural glass materials having a sufficient transmission factor and, for this reason, correction of chromatic aberration is attainable with a combination of dioptric optical elements. On the other hand, as regards an ultraviolet region of a currently used KrF excimer laser ($\lambda$=248 nm) or a next-generation ArF excimer laser ($\lambda$=139 nm), for example, glass materials having a sufficient transmission factor are only $SiO_2$ and $F_2$. Further, as for an $F_2$ laser ($\lambda$=157 nm), only $CaF_2$ is available. Although the bandwidth of an emission spectrum of a laser light source is narrow, the imaging performance required for a projection optical system of a semiconductor manufacturing apparatus is extraordinarily high. Therefore, with an optical system constituted by dioptric systems only, there arises a problem of chromatic aberration. For this reason, a strict condition that the bandwidth must be not greater than 1 pm is additionally applied to the light source, and this necessitates a structure for narrowing the bandwidth. Further, the number of lenses required for sufficiently reducing the wavefront aberration of the optical system becomes larger, and this leads to an increase of the lens whole thickness and an increase of the surfaces where an anti-reflection film should be applied. As a result, the transmission factor of the optical system as a whole becomes lower. This means that the absorption of exposure light by the lens system as a whole increases, and it is undesirable also with respect to the aberration (exposure aberration) produced with the exposure.

Use of a diffractive optical element may be effective for problems of an increase in total lens thickness or lens surfaces or large aberration correction.

Although the advantages of diffractive optical elements themselves are known in the art, many proposals for such optical systems (e.g., Japanese Laid-Open Patent Application, Laid-Open No. 331941/1994) are made recently just after a binary optics element (BOE) is proposed. Details of such a binary optics element are discussed in G. J. Swanson, Technical Report 854, MIT Lincoln Laboratory, Aug. 14, 1989, or G. J. Swanson, Technical Report 914, MIT Lincoln Laboratory, Mar. 1, 1999, for example.

Conventionally, from the machining precision and the like, it is very difficult to directly produce an idealistic shape (blazed shape) required for a diffractive optical element, that is, a shape necessary for correctly depicting the phase function. In the case of binary optics, however, a blazed shape is not directly produced, but it is approximated by use of a step-like shape. Such a step-like shape can be produced precisely in a very fine structure, through a lithographic process and by use of a stepper as an exposure apparatus.

Now, a description will be made with reference to an idealistic lens for converging parallel light to a single point. In order that parallel light (plane wave) incident on a lens is converged to a single point, a phase function such as follows may be given:

$$\phi(r) = -2\pi[(r^2+f^2)^{1/2}-f]/\lambda \qquad (1)$$

where f is the focal length, $\lambda$ is the wavelength of light used, and r is the distance from an arbitrary origin.

In the diffractive optical element, the fact that light has a period of $2\pi$ with respect to the phase is used. First, the value of $r=R_m$ with which the value of a phase function $\phi(r)$ becomes equal to a multiple of $2\pi$, by an integer, is calculated (wherein m is an integer not less than 0, and, while taking $R_0$=0, the counting is done sequentially from the origin toward the outside), and a phase function $\phi'(r)$ having a multiple of $2\pi$ added is prepared so that in the period [$R_m$, $R_{m+1}$] the value of $\phi(r)$ comes into range [0, $2\pi$]. An optical element having its surface shaped to satisfy this phase function $\phi'(r)$ is thus an idealistic lens based on a diffractive optical element. FIGS. 1A and 1B are schematic view of such a surface shape. The ring interval $T_m$ may be defined as $T_m=R_{m+1}-R_m$. The ring interval is relatively large at the central portion (r to 0) and, depending on the difference in m, the difference in ring interval is large. On the other hand, at the peripheral portion, the ring interval is approximately regular even if the value of m differs and, therefore, it can be considered to be a regular interval grating.

Reference numeral 101 denotes the surface shape at the central portion, and it is a blazed shape which completely describes the phase function. Here, the shape 101 is a portion of a curved surface. On the other hand, reference numeral 102 denotes a blazed shape at the peripheral portion. It can be considered to be approximately a plane.

FIGS. 2A and 2B are schematic views of a surface shape, wherein an idealistic lens is manufactured as binary optics. This shape is provided by approximating the blazed shape of FIG. 1 by a step-like shape. Here, the step difference (height) of the steps may be determined so that the phase is sampled with regular intervals. Namely, if the depth in the case of the blazed shape is D and the number of approximated steps is N, each step has a height D/N. Since the step difference (height) is made constant, the width of each step is uneven in the portion 103 where a curved surface is approximated, whereas the width of each step is even at 104 where a plane is approximated.

In the binary optics, however, since the shape is based on the approximation, the diffraction efficiency does not reach 100% and unwanted diffraction light is produced. When the number of steps approximated is N and the diffraction order (design order) set to satisfy the imaging condition is 1, the diffraction efficiency $\eta^N_m$ for the diffraction order m can be expressed as follows:

$$\eta^N_m = \left[\frac{\sin(\pi m/N)\sin\{\pi(1-m)\}}{\pi m \sin\{\pi(1-m)/N\}}\right]^2 \quad (2)$$

Here, the depth of the element should be optimized with respect to the wavelength λ used. The height d of one step in this case is, assuming that the element made of a glass of a refractive index n is placed in air (refractive index 1.0), d=λ/(n−1.0)/N.

Generally, the bandwidth of the wavelength used in a projection optical system of a semiconductor manufacturing apparatus is about 1 pm. This is a bandwidth required because of a difficulty in correction of chromatic aberration in a lens system. Even when a diffractive optical element is combined with a lens system to enable correction of chromatic aberration in a certain range, if the light source used is a laser, the bandwidth is 1 nm at the largest. In order that the relation (2) is satisfied, the depth must be optimized with respect to the wavelength. However, since this is a very narrow bandwidth such as described above, the wavelength dependency of the diffraction efficiency can be substantially disregarded.

If, in equation (2), it is assumed that N→∞, it follows that:

$\eta^\infty_1 = 1$.

It is seen therefrom that the diffraction efficiency is 100% in an idealistic case. However, from the diffraction efficiency and the smallest linewidth that can be produced, practically, a value about N=8 is used. The diffraction efficiency in that case is $\eta^8_1=0.95$. Further, $\eta^8_m$ takes a value only when m= . . . , −15, −7, 1, 9, 17, . . . , such that it can be expressed as follows:

$$\eta^8_m = [\sin(\pi m/8)/(\pi m/8)]^2 \quad (3)$$

For example, $\eta^8_9=0.0117$ and $\eta^8_{-7}=0.0194$ are obtained. Namely, for binary optics with eight steps, the diffraction efficiency becomes "not zero" at an order as represented by m=8k+1 (k is an integer). Generally, for steps N, the diffraction efficiency becomes "not zero" at an order represented by m=Nk+1 (k is an integer). Also, when the step-like shape is not formed idealistically, or when it is not made in conformity with the condition for application of the scalar diffraction theory, the diffraction efficiency at an order of an arbitrary integer m becomes "not zero". In the following description, the light directed to orders other than the design order will be referred to as an "unwanted diffraction order". Particularly, the order Nk+1 (N is the number of steps and k is an integer other than zero), other than the design order, where the diffraction efficiency becomes "not zero", under an idealistic condition (with an idealistic step shape), will be referred to as a "major unwanted diffraction order".

As described, when a binary optics element is used, there may be present unwanted diffraction orders appearing in particular order (directions). Since these light rays do not satisfy the imaging condition, when they are incident on an image plane, they appear as a flare component, causing degradation of the imaging characteristic. As regards the unwanted diffraction light which reaches the image plane, there are two types: light reflected once or more by a barrel, and light passing directly through the effective diameter of the optical system. As regards the light reflected by the barrel, it can be reduced sufficiently to a low level by designing the barrel and using anti-reflection. The light passing directly through the effective diameter of the optical system raises a problem.

When the influence of unwanted diffraction light is evaluated, both the intensity and the distribution of the unwanted diffraction light on the image plane with respect to the design order should be considered. The intensity should desirably be almost zero. However, as a tolerance, even if the intensity is about 1%, the distribution thereof on the image plane may be substantially uniform. On that occasion, since the unwanted diffracted light is added as an even (uniform) background light, the image contrast decreases slightly. Since, however, the contrast on the image plane as a whole is approximately even, it can be met by a subsequent process.

When a binary optics element is disposed adjacent to an object plane or image plane, the intensity of unwanted diffraction light on the image plane becomes larger and, additionally, exposure non-uniformness occurs. If it is disposed adjacent to a pupil plane of the projection optical system, the intensity is sufficiently small and substantially no exposure non-uniformness occurs. However, if the phase function applied to the binary optics element is sufficiently low, namely, the ring interval is sufficiently large, the intensity becomes large even though the element is disposed adjacent to the pupil plane. This can be explained qualitatively as that, as the ring interval becomes larger, the diffraction angle of (higher order) unwanted diffraction light becomes smaller such that the light passing through the effective diameter of the optical system increases. Therefore, in order to suppress the strength of the background light, the ring interval should be kept sufficiently small throughout the whole element. However, in a binary optics element having an ordinary condensing power, the ring intervals are very loose at the center while they are tight at the peripheral portion. It is, therefore, difficult to make the ring interval small over the whole element. This means that, as long as the number N of steps is fixed, unwanted light from a central region, where the ring interval is large, impinges on the image plane.

If the number N of the steps is made larger, the order of the unwanted diffraction light becomes largely different from the design order and thus the influence of the unwanted diffraction light is reduced. However, the size of N is limited by the production precision. For example, when an ordinary i-line stepper is used, the linewidth to be produced is about 0.3 micron. When a step-like structure with sixteen steps is made on the basis of it, the ring interval will be 5.6 microns.

This value is not sufficient for completely correcting chromatic aberration in a projection optical system when a KrF excimer laser is used as a light source, and a narrow ring interval is required. Additionally, the manufacture of a step-like structure with sixteen steps requires the procedure including a plurality of processes. If plural processes are executed with a smallest linewidth close to the production limit, an intended step-like shape is not obtainable, and a production error easily occurs. Such a production error causes not only a major unwanted diffraction order m=Nk+1, but also lower order unwanted diffraction lights close to the design order.

SUMMARY OF THE INVENTION

It is accordingly an object of the present invention to provide an optical system with a diffractive optical element by which the influence of produced unwanted diffraction light to the imaging can be minimized, such that it can be applied as an optical system such as a projection optical system in a semiconductor manufacturing apparatus, for example, wherein an extraordinarily high imaging performance is required.

In accordance with an aspect of the present invention, there is provided a projection optical system with a diffractive optical element, characterized in that said diffractive optical element is arranged so that a portion of or most of diffraction light not to be used for projection of an image is prevented from being incident inside an image projection range upon an image plane.

In accordance with another aspect of the present invention, there is provided a projection optical system with binary optics, characterized in that the number of steps in each of the rings of said binary optics is determined in accordance with a ring interval of each ring so that a portion of or most of diffraction light not to be used for projection of an image is prevented from being incident inside an image projection range.

In this aspect of the present invention, said binary optics may be disposed adjacent to an aperture stop of said projection optical system.

When the number of steps is N and the ring interval is T, the following relation may be satisfied:

$$16 \geq N \geq T \sin \theta_h / \lambda,$$

where $\lambda$ is a representative value of a wavelength of light to be used with said projection optical system, and $\theta_h$ is an angle defined, with respect to an optical axis of said projection optical system, by a light ray emitted from a largest object height of said projection optical system and passing through a center of said aperture stop.

Each ring of said binary optics may have at least eight steps.

In accordance with a further aspect of the present invention, there is provided a projection optical system with a diffractive optical element, characterized in that an aperture larger than an image to be projected on an image plane is provided adjacent to the image plane.

In accordance with a yet further aspect of the present invention, there is provided an optical system with a diffractive optical element, characterized in that a stop is provided adjacent to an image plane.

In these aspects of the present invention, an aperture stop may be provided at a position different from the position adjacent to the image plane.

A portion of diffraction light emitted from said diffractive optical element and not to be used for projection of an image may be intercepted by a light blocking portion of said stop.

Another portion of the diffraction light emitted from said diffractive optical element and not to be used for the image projection may be incident on an inside wall of a barrel of said optical system.

A further portion of the diffraction light not to be used for the image projection may pass through the aperture of said stop and may be superposed with the image, while a light intensity distribution of the further portion upon the image plane may be substantially uniform.

The diffractive optical element may comprise binary optics, and said optical system may include one or plural binary optics.

When the number of steps of each of the rings of said binary optics is N and the ring interval of each ring is T, the following relation may be satisfied:

$$16 \geq N \geq T \sin \theta_h / \lambda,$$

where $\lambda$ is a representative value of a wavelength of light to be used with said projection optical system, and $\theta_h$ is an angle defined, with respect to an optical axis of said projection optical system, by a light ray emitted from a largest object height of said projection optical system and passing through a center of said aperture stop.

Each ring of said binary optics may have at least eight steps.

In accordance with a still further aspect of the present invention, there is provided a projection exposure apparatus for sequentially imaging a pattern of a mask on plural regions of a substrate to be exposed, by use of an optical system as recited above.

In accordance with a yet further aspect of the present invention, there is provided a device manufacturing method, comprising the steps of: exposing a wafer with a device pattern by use of an exposure apparatus as recited above; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic views, respectively, for explaining a blazed shape.

FIGS. 2A and 2B are schematic views, respectively, for explaining a step-like shape, as approximating the blazed shape.

FIG. 6 is an enlarged and perspective view of an aperture stop disposed adjacent to the image plane.

DESCRIPTION OF THE PREFERRED EMBODIMENTS

Figure 3:
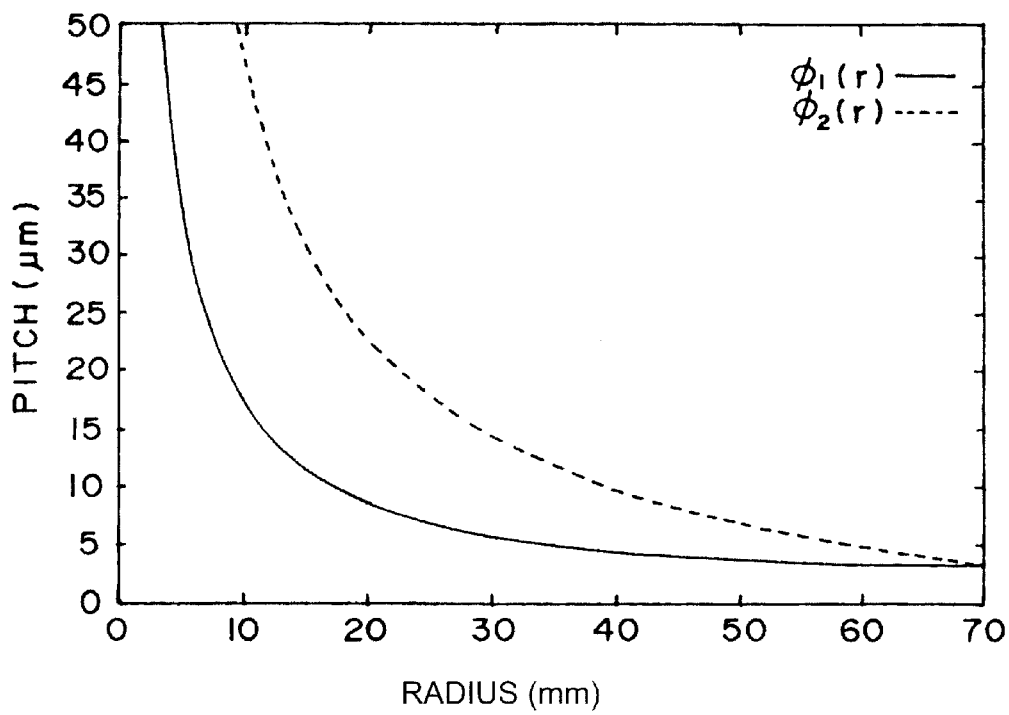
FIG. 3 is a graph for explaining a distribution of ring intervals of a binary optics element, in a projection optical system according to an embodiment of the present invention.

Generally, in accordance with the present invention, the influence of unwanted diffraction light upon an image plane of a projection optical system of a semiconductor manufacturing exposure apparatus, for example, can be reduced significantly. Also, the influence of unwanted diffraction light to a region adjacent to the image plane field can be prevented.

This will be described in more detail.

When light of a wavelength λ (value in a vacuum) which advances in a medium of a refractive index $n_1$ is incident on a binary optics element being made of a glass material of a refractive index $n_2$, at an incidence angle $\theta_1$, the emission angle $\theta_2$ of light to be emitted as m-th order diffraction light is:

$$n_2 \sin \theta_2 - n_1 \sin \theta_1 = m\lambda/T \qquad (4)$$

wherein the binary optics element has a revolutionally symmetric structure and a phase function $\phi(r)$ can be described as a function of the distance r from the center. Here, T is the ring interval of the binary optics element at the incidence position, and it can be give as $T(r)=2\pi|d\phi(r)/dr|^{-1}$.

If perpendicular incidence ($\theta_1 = 0$) is assumed for simplicity, from equation (4) it follows that:

$$\sin \theta_2 = m\lambda/(n_2 T) \qquad (5)$$

Equation (5) above shows that, as the ring interval becomes smaller, the emission angle $\theta_2$ of an arbitrary diffraction order m becomes larger. Also, the emission angle $\theta_2$ becomes larger as the diffraction order m becomes larger.

Particularly, when the binary optics element is disposed adjacent to a pupil plane of the projection optical system, since the angular distribution on the pupil plane corresponds to the intensity distribution on the image plane, the emission angle distribution of the light rays upon the optical element can be regarded as substantially corresponding, in one-to-one relation, to the intensity distribution on the image plane. Here, since the chief ray at the largest object height reaches the edge of the image plane, the emission angle $\theta_h$ of this light ray upon the image plane can be regarded as a largest angle α such that the light can pass inside the effective diameter of the optical system and can reach the range of a projected image (hereinafter, also referred to as an image plane field). Also, this value is almost independent from the position r on the element. Thus, the condition for that m-th order diffraction light which reaches outside the image plane field is such that the angle defined between the design order and the m-th order is larger than $\theta_h$. This angle $\theta_h$ is an angle on the pupil plane, and usually the pupil plane can be regarded as being placed in air. On the other hand, since the angle $\theta_2$ is the emission angle to a medium of a refractive index $n_2$, for correspondence to the angle $\theta_h$, $n_2$ may be regarded as being approximately equal to 1.0, independently of the refractive index at the light exit side. Here, $n_2$ may be a practical value, with a result that the condition becomes strict. From the foregoing, it is seen that m-th order diffraction light from a region where the ring interval is smaller than $T_1=(m-1)\lambda/\sin \theta_h$ does not impinge on the image plane.

Next, when the binary optics element has a step-like structure with steps N, while the major order which appears as unwanted diffraction light is m=Nk+1, the diffraction angle is smallest with k=±1 which is closest to the design order. Thus, unwanted light from a region, wherein the ring interval is smaller than a value given by the following equation, does not contribute to the image plane field:

$$T_1 = N\lambda/\sin \theta_h \qquad (6)$$

From equation (6) above, it is seen that, with a larger number of steps, the ring interval with which the unwanted diffraction light has no contribution can be made larger.

In ordinary binary optics elements having a light converging or diverging function, the ring interval is larger at the central portion and it is smaller at the peripheral portion. Therefore, as regards the peripheral portion, even if the number of steps is made smaller, light of a major unwanted diffraction order is not incident inside the range of the image plane. As regards the central portion, however, the number of steps must be made larger. The number may be determined in accordance with equation (6) or $N=T_1 \sin \theta_h/\lambda$ as a modified equation of it.

Equations (2) to (6) are applicable when a regular interval grating is assumed, but they are not applicable to an irregular interval grating such as the center. However, usually, the ring interval about the center has a size of a few tens of microns, and a blazed shape can be produced directly. Therefore, if necessary, the element may be made not with a binary shape (step-like shape) but with a blazed shape (kinoform).

If the number N of steps of the binary optics element becomes large, the number of masks to be used increases and also the process becomes complicated. Thus, it becomes difficult to accomplish a desired shape. The number N of steps should be determined in consideration of it. Here, while taking into account the ring interval and the number of masks required to enable production of a blazed shape, about a number N=16 may be desirable. When a structure of sixteen steps is used and each step is formed with a size of 1.5 micron, the ring interval is 24 microns. With this ring interval, in an optical system to be described later, there is no influence of the major unwanted diffraction order from the sixteen steps. Also, if the ring interval is larger than this value, a blazed shape can be produced sufficiently by milling, for example.

Here, unwanted diffraction light in a projection optical system having two binary optics elements will be described. This projection optical system is a reduction projection optical system of a reduction ratio 1:5, and the wavelength used λ=248 nm, the largest object height is 78 mm (largest image height of 15.6 mm), and the numerical aperture NA=0.6. The phase functions for the two binary optics elements disposed at two locations are given by:

$$\phi_1(r) = 0.01812r^2 - 1.7000e - 7r^4 - 4.190e - 11r^6$$

$$\phi_2(r) = 0.006593r^2 + 2.835e - 7r^4 + 5.681e - 11r^6.$$

FIG. 3 shows the ring intervals according to these phase functions. These binary optics elements may be disposed very close to an aperture stop of the projection optical system.

Figure 4:
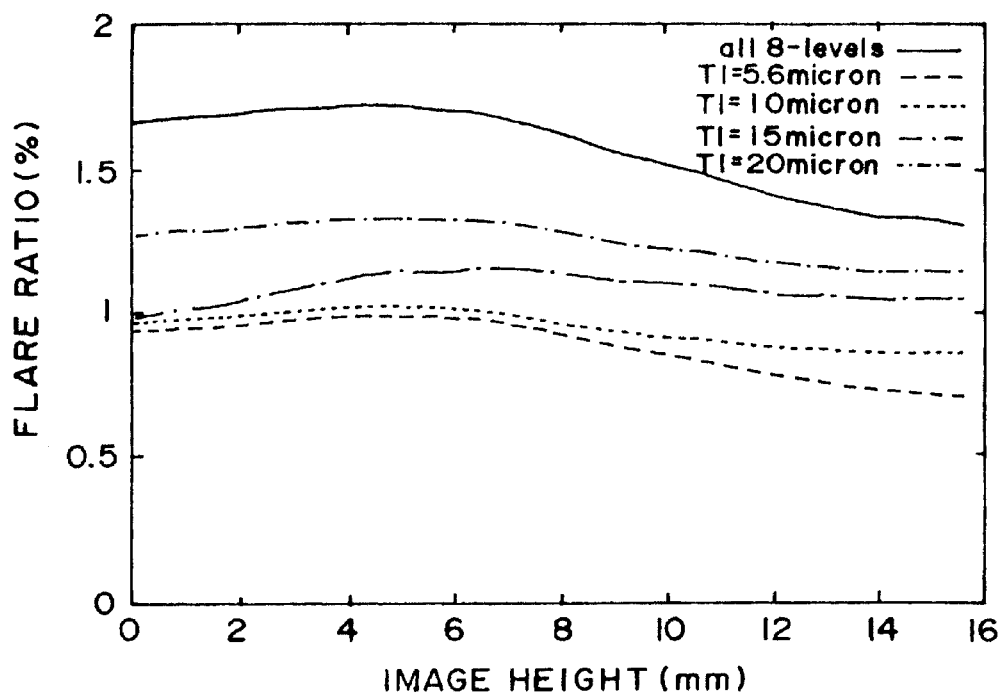
FIG. 4 is a graph for explaining an image plane intensity distribution of unwanted diffraction light, in a projection optical system with a binary optics element according to an embodiment of the present invention.

In this projection optical system, the intensity distribution within the image plane field was calculated with respect to unwanted diffraction light of orders from −15th to +17th. FIG. 4 shows the results in terms of the ratio to the first-order diffraction light intensity to be used for the image formation. Here, the binary optics element was structured while taking $T_1$ as a threshold, and N=16 where $T_1$ was exceeded and N=8 where $T_1$ was not exceeded. Four values 5.6, 10, 15 and 20 (microns) were taken for $T_1$. Further, for comparison, an all eight-level structure is illustrated there. Here, the values of diffraction efficiencies of required respective order were calculated in accordance with a method "Rigorous Coupled-Wave Analysis", M. G. Moharam, et al., e.g., Journal of the Optical Society of America, A. Vol.12, No.5, pages 1068–1076, 1995.

It is seen from simple ray tracing that, in this projection optical system, the angle of the chief ray from a largest object height as defined on the aperture stop plane and with respect to the optical axis is equal to 8.34 (deg.). This corresponds to the angle $\theta_h$ in equation (6). Further, when N=8 and $\lambda$=248 (nm) are used, the value of $T_1$ for the number 8 of the steps is 13.7 microns.

In FIG. 4, in the cases where $T_1$ is 5.6 microns and 10 microns, respectively, the intensity of the unwanted diffraction light is substantially unchanged, and it is about 1%. However, with 15 microns, which is beyond this $T_1$, particularly, in the region where the image height is large. Further, with 20 microns, as compared with 5.6 microns or 10 microns, it increases by about 0.3% and becomes close to that of the all eight-level structure.

As described above, if the limit of the ring interval in equation (6) is exceeded, a major unwanted diffraction order enters the image plane field so that the relative intensity of the unwanted diffraction light increases. If, however, the limit in equation (6) is held, the influence of the unwanted diffraction light can be reduced even without using a smallest linewidth corresponding to the production limit.

When the influence of the major unwanted diffraction light in the image plane field is reduced in accordance with equation (6), it reaches outside the image plane field. Although it raises no problem in cases of usual cameras or light receiving systems, since in a semiconductor manufacturing apparatus of a step-and-repeat type or step-and-scan type, the exposure is carried out also with respect to a region adjacent to the image plane field, there may be a possibility that the image performance is degraded due to impingement of unwanted diffraction light on a region outside the image plane field. In consideration of it, an aperture stop may preferably be disposed adjacent to the image plane so that light of a major unwanted diffraction order does not reach a region adjoining the image plane field.

Figure 5:
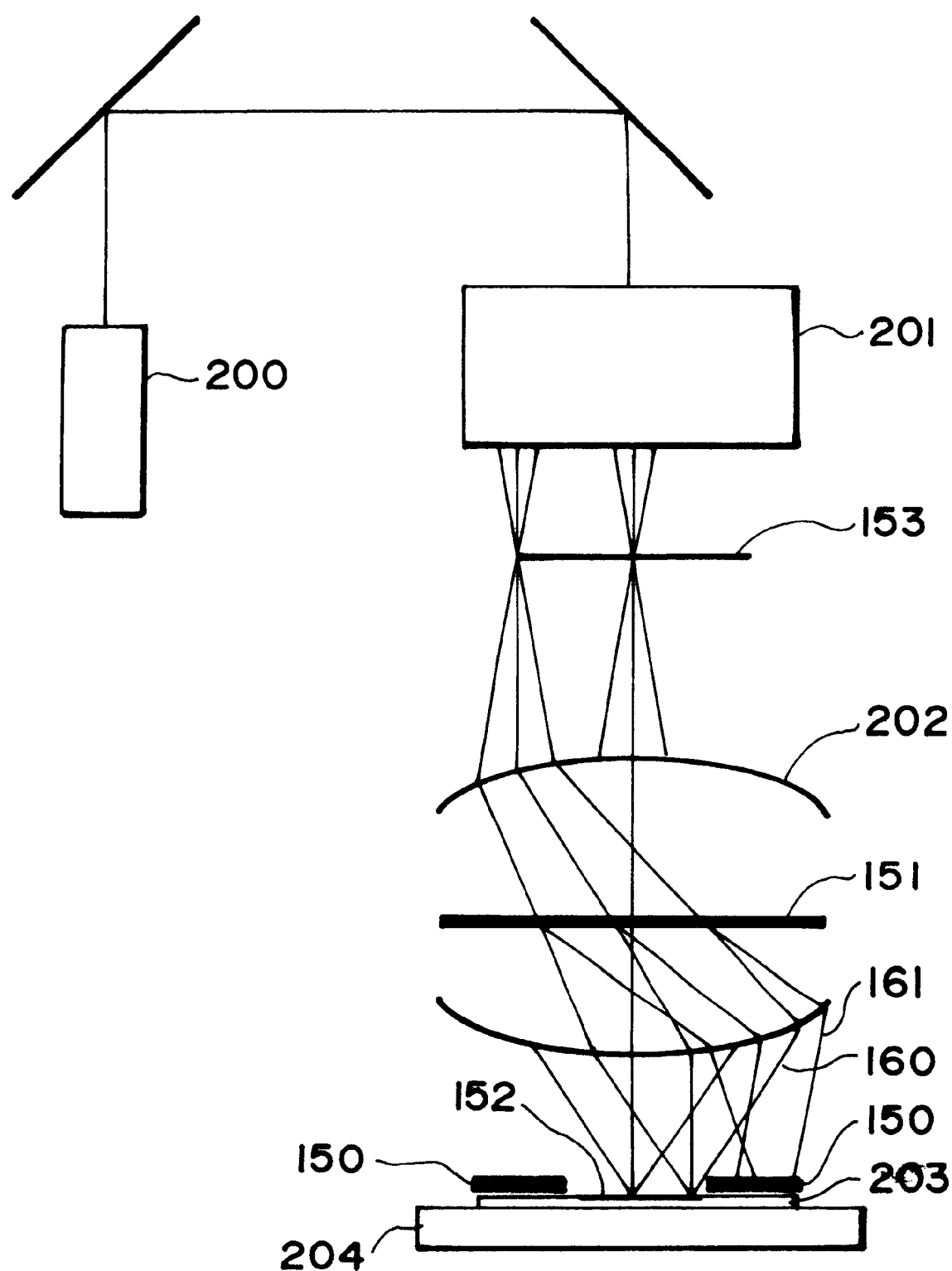
FIG. 5 is a schematic view of a projection optical system with a binary optics element, according to an embodiment of the present invention, wherein an aperture stop is disposed adjacent to an image plane.

FIG. 5 shows a projection optical system according to an embodiment of the present invention, wherein a stop (aperture) 150 is disposed adjacent to the image plane. This optical system is a projection optical system for a projection exposure apparatus of a step-and-repeat type or step-and-scan type, and the design wavelength is not longer than 250 nm. Light emitted from a light source 200 which may comprise one of a KrF excimer laser, an ArF excimer laser and an $F_2$ excimer laser, passes through an illumination optical system 201 and illuminates a reticle 153 on which a device pattern to be projected is formed. This device pattern is imaged on a wafer 203 by a projection optical system 202. The wafer thus exposed with the device pattern (image) as imaged thereupon is then developed and etched by use of a resist mask, whereby the device pattern is reproduced on the wafer. The range for the image being projected here is illustrated at 152 in the drawing. Denoted at 204 is a movable stage for holding the wafer 203. In the projection optical system 202, there is one or more binary optics elements 151 disposed close to the pupil plane, corresponding to the position of the aperture stop. The light 160 of a design order is imaged within the range 152. On the other hand, diffraction light 161 of major unwanted diffraction orders produced by the optical element 151 is incident outside this range. The number of steps or the like of the binary optics element 151 is set to this end. The stop 150 may be disposed adjacent to the image plane, so as to prevent the unwanted diffraction light 161 from reaching the wafer 203, and the diffraction light 161 is incident on the light blocking portion (non-aperture area) of this stop. Here, unwanted diffraction light, if any, emitted from the element 151 with a diffraction angle larger than that of the unwanted diffraction light 161, is incident on an inside wall of a barrel (not shown) for holding the optical system 202 where a light blocking treatment has been made. The stop 150 is held by this barrel.

As regards the condition required for the stop 150, first, it should not intercept diffraction light of a design order which is contributable to the imaging of a pattern. Additionally, it should prevent, as much as possible, unwanted diffraction light 161 from impinging on an adjacent region (adjacent shot) of the exposure region (current shot) just to be exposed. This minimizes the influence of diffraction. This condition may be satisfied by providing a stop 150 having an aperture larger than the image plane field 152, in close proximity to the image plane. Alternatively, the size of the aperture of the stop 150 may be enlarged so that diffraction light of the design order is not eclipsed even if the aperture is placed away from the image plane. Further, if a portion of the unwanted diffraction light emitted from the element 151 passes through the aperture of the stop 150 and enters the field 152, the image plane intensity distribution of the incident diffraction light may be made even (uniform) in accordance with a procedure as disclosed in Japanese Laid-Open Patent Application, Laid-Open No. 303127/1998.

The diffractive optical element used in the present invention is not limited to a binary diffraction grating. It may comprise a diffraction grating of a combined kinoform type and binary type, or a diffraction grating of a kinoform type (blazed type).

In accordance with the embodiments of the present invention described hereinbefore, when a diffractive optical element is used in a projection optical system, the influence of unwanted diffraction light on the image plane can be reduced significantly. Further, an aperture stop for blocking unwanted diffraction light, but not intercepting light of a design order, being contributable to the imaging, may be provided adjacent to an image plane. This effectively prevents the influence of unwanted diffraction light to a region adjacent to the image plane field, and assures a stable imaging performance.

While the invention has been described with reference to the structures disclosed herein, it is not confined to the details set forth and this application is intended to cover such modifications or changes as may come within the purposes of the improvements or the scope of the following claims.

What is claimed is:

1. An optical system comprising:
   a diffractive optical element, wherein an aperture larger than an image to be projected on an image plane is provided adjacent to the image plane.

2. An optical system comprising:
   a diffractive optical element, wherein a stop is provided adjacent to an image plane.

3. An optical system according to claim 1 or 2, wherein an aperture stop is provided at a position different from the position adjacent to the image plane.

4. An optical system according to claim 2, wherein a portion of diffraction light emitted from said diffractive optical element and not to be used for projection of an image is intercepted by a light blocking portion of said stop.

5. An optical system according to claim 4, wherein another portion of the diffraction light emitted from said diffractive optical element and not to be used for the image projection is incident on an inside wall of a barrel of said optical system.

6. An optical system according to claim 5, wherein a further portion of the diffraction light not to be used for the image projection passes through the aperture of said stop and is superposed with the image, while a light intensity distribution of the further portion upon the image plane is substantially uniform.

7. An optical system according to claim 1 or 2, wherein said diffractive optical element comprises binary optics, and wherein said optical system includes one or plural binary optics.

8. An optical system according to claim 7, wherein, when the number of steps of each ring of said binary optics is N and the ring interval of each ring is T, the following relation is satisfied:

$$16 \geq N \geq T \sin \theta_h / \lambda,$$

where $\lambda$ is a representative value of a wavelength of light to be used with said optical system, and $\theta_h$ is an angle defined, with respect to an optical axis of said optical system, by a light ray emitted from a largest object height of said optical system and passing through a center of said aperture stop.

9. An optical system according to claim 8, wherein each ring of said binary optics has at least eight steps.

10. A projection exposure apparatus for sequentially imaging a pattern of a mask on plural regions of a substrate to be exposed, by use of an optical system as recited in any one of claims 1 and 2.

11. A device manufacturing method, comprising the steps of:

exposing a wafer with a device pattern by use of an exposure apparatus as recited in claim 10; and developing the exposed wafer.

12. An optical system, comprising:

an aperture stop; and binary optics having a plurality of rings and being disposed adjacent to said aperture stop, said rings of said binary optics having different mutual intervals and having a step-like structure formed at each interval, wherein, when the interval of arbitrary rings of said rings, being juxtaposed with each other, is T and the number of steps defined in that interval is N, the following relation is satisfied in all the rings included in said binary optics:

$$16 \geq N \geq T \cdot \sin \theta_h / \lambda$$

where $\lambda$ is a representative value for a wavelength of light used in said optical system, and $\theta_h$ is an angle defined, with respect to an optical axis of said optical system, by a light ray emitted from an object point at a largest object height and passing a center of said aperture stop.

13. An optical system according to claim 12, wherein each ring of said binary optics has at least eight steps.

14. A projection exposure apparatus for sequentially imaging a pattern of a mask on plural regions of a substrate to be exposed, by use of an optical system as recited in claim 12.

15. A device manufacturing method, comprising the steps of:

exposing a wafer with a device pattern by us of an exposure apparatus as recited in claim 14; and developing the exposed wafer.

* * * * *